United States Patent [19]

Ogata et al.

[11] 4,437,135

[45] Mar. 13, 1984

[54] SEMICONDUCTOR INTEGRATED CIRCUIT DEVICE

[75] Inventors: Masahiro Ogata; Osamu Sakai, both of Kodaira, Japan

[73] Assignees: Hitachi, Ltd.; Hitachi Microcomputer Engineering, Ltd., both of Tokyo, Japan

[21] Appl. No.: 319,077

[22] Filed: Nov. 6, 1981

[30] Foreign Application Priority Data

Nov. 7, 1980 [JP] Japan .................................. 55-155863

[51] Int. Cl.³ .............................................. H02H 9/04
[52] U.S. Cl. ...................................... 361/91; 361/101; 357/23
[58] Field of Search ............................ 361/91, 101, 58; 357/23 GP, 51; 307/200 B

[56] References Cited

U.S. PATENT DOCUMENTS

| | | |
|---|---|---|
| 3,395,290 | 7/1968 | Farina . |
| 3,403,270 | 9/1968 | Pace et al. . |
| 3,746,946 | 7/1973 | Clark . |
| 3,819,952 | 6/1974 | Enomoto et al. ................. 357/41 X |
| 3,999,212 | 12/1976 | USUDA . |
| 4,057,844 | 11/1977 | Smedley ...................... 307/200 B X |

FOREIGN PATENT DOCUMENTS 2356273 1/1978 France .

OTHER PUBLICATIONS

IBM Technical Disclosure Bulletin, vol. 13, No. 9, Feb. 1971, p. 2800.
Patent Abstracts of Japan, vol. 4, No. 112, Aug. 12, 1980, p. 24e21.

*Primary Examiner*—Reinhard J. Eisenzopf
*Attorney, Agent, or Firm*—Antonelli, Terry & Wands

[57] ABSTRACT

In the past, it has been a problem in integrated circuits using MOSFETs that the gate insulating film of a transmission gate MOSFET is broken down when an abnormally high voltage such as is caused by frictional static electricity is applied to its drain region. This breakdown of the gate insulating film cannot be prevented merely by limiting the voltage level applied to the drain region to a level below the breakdown withstand voltage of the gate insulating film. The reason for this is that even with such voltage limiting, the breakdown of the gate insulating film can still occur when local heating is generated by a relatively large breakdown current flowing through the drain junction. To prevent such a breakdown of the gate insulating film, therefore, a resistance element for limiting the breakdown current is connected in series with the drain region of the transmission gate MOSFET.

22 Claims, 5 Drawing Figures

SEMICONDUCTOR INTEGRATED CIRCUIT DEVICE

BACKGROUND OF THE INVENTION

This invention relates to a semiconductor integrated circuit device (IC) including MOSFETs (insulated gate field effect transistors).

Quite often, an abnormally high voltage (i.e. surge voltage) such as that caused by frictional static electricity is undesirably applied to an external terminal of a semiconductor integrated circuit device during transportation or handling of the device. Unless some type of protection is provided, this abnormally high voltage will cause a breakdown of the gate insulating film of the device. Accordingly, to prevent breakdown of the gate insulating film of a MOSFET for a signal input due to such an abnormally high voltage, an input protective circuit is generally disposed in a semiconductor integrated circuit consisting of MOSFETs. In this case, it has been commonly believed that it is primarily only a voltage level applied between the gate and source or between the gate and drain of the MOSFET which determines if the gate insulating film of the MOSFET is broken down or not. For this reason, the ordinary input protective circuit is constructed to limit the voltage applied across the gate and source or across the gate and drain of the signal input MOSFET to a level below that of the breakdown voltage of the gate insulating film.

As will be described in detail herein, however, the inventors of the present invention have found that in a semiconductor integrated circuit device including an input circuit of a type in which a signal to be applied to the external terminal is directly applied to a transmission gate MOSFET (hereinafter referred to as the "drain input type"), the gate insulating film is broken down even when the peak value of the surge voltage applied to the input electrode of the transmission gate MOSFET, or the drain or source electrode, is limited by an input protective circuit to a level below the breakdown voltage of the gate insulating film.

SUMMARY OF THE INVENTION

Accordingly, it is an object of the present invention to provide a semiconductor integrated circuit device including an input circuit of the drain input type whose electrostatic breakdown strength is improved.

It is another object of the present invention to provide a semiconductor integrated circuit device including an input protective circuit capable of minimizing the drop in the signal change speed.

It is another object of the present invention to provide a semiconductor integrated circuit device including an input protective circuit suitable for a semiconductor memory.

It is still another object of the present invention to provide a semiconductor integrated circuit device which is relatively easy to fabricate.

To achieve these and other objects, the present invention provides a resistance element coupled between an external terminal of the integrated circuit to which an input signal is applied and a transmission gate MOSFET of the integrated circuit. The resistance value of this resistance value is set so that when an abnormal surge voltage is applied to the external terminal, the resistance element will reduce a breakdown current flowing through a semiconductor junction of the transmission gate MOSFET to a level lower than a breakdown current level that causes breakdown of a gate insulating film of the MOSFET.

BRIEF DESCRIPTION OF THE DRAWINGS

These and other objects of the present invention will become more apparent from the following detailed description of the invention taken in conjunction with the accompanying drawings in which.

DETAILED DESCRIPTION OF THE INVENTION

Figure 1:
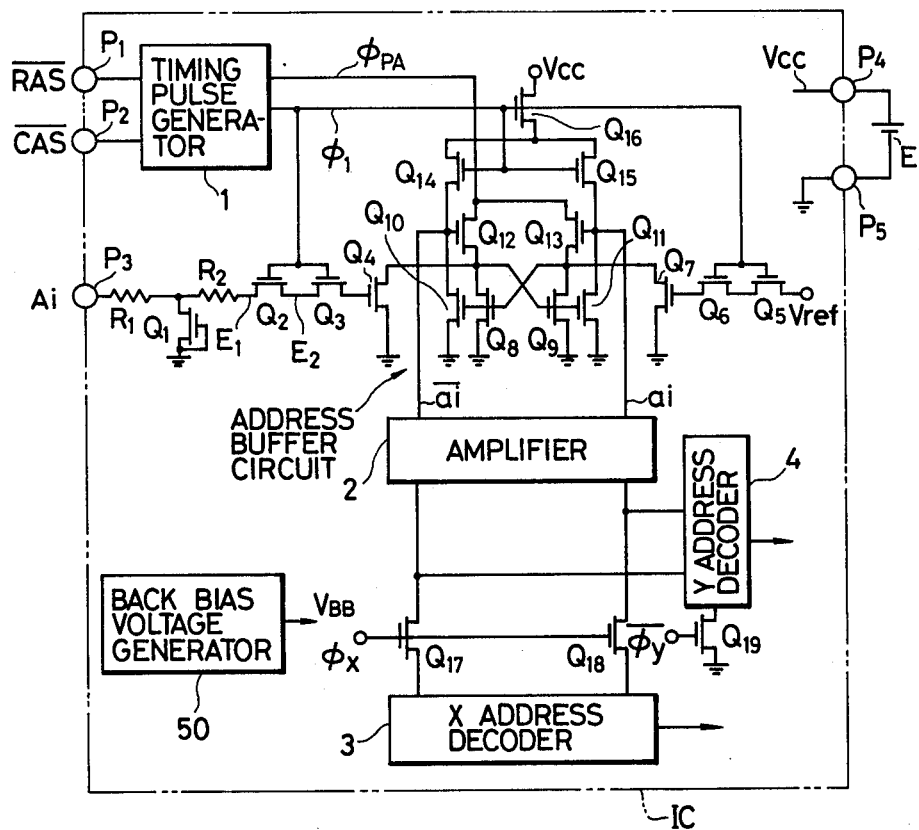
FIG. 1 is a circuit diagram showing an embodiment of the present invention.

Hereinafter, the present invention will be described in detail with reference to embodiments thereof.

The present invention is based upon the following facts and observations made by the inventors thereof.

Specifically, the inventors of the present invention have confirmed by carrying out experiments that in a semiconductor integrated circuit device (hereinafter referred to as an "IC"), even if an input protective circuit is provided which consists of, for example, a semiconductor resistor inserted between a signal input external terminal and an input electrode of a transmission gate MOSFET and a voltage clamping MOSFET inserted between the input terminal and a ground potential point of the circuit, the problem remains that the gate insulating film of the transmission gate MOSFET can be broken down by an abnormally high voltage applied to the external terminal. Due to such a breakdown of the gate insulating film, the gate electrode and the input electrode (drain electrode) are short-circuited. Incidentally, the voltage-current characteristic of the drain junction remains substantially unchanged. Breakdown is especially likely to occur if the size of the transmission gate MOSFET is smaller than that of the clamping MOSFET, or if the channel length of the former is made shorter than that of the latter in order to improve characteristics of the transmission gate MOSFET such as an input signal transmission speed. The gate insulating film of the clamping MOSFET has a breakdown withstand voltage equal to that of the gate insulating film of the transmission gate MOSFET while the drain of the former is commonly connected to that of the latter. Accordingly, an equal surge voltage is applied to the drains of both clamping and transmission gate MOSFETs. Nevertheless, the gate insulating film of the clamping MOSFET is more difficult to break down.

The mechanism of why and how the gate insulating film of the transmission gate MOSFET breaks down even at a voltage below its breakdown voltage has not yet been completely established. However, the inventors' experiments have led to the following assumptions which may be made from factors relating to the size of the transmission gate MOSFET, factors associated with the circuit construction, and from the fact that the gate insulating film of the clamping MOSFET is more difficult to break down.

To begin with, the breakdown voltage at the p-n junction between the drain or source of the MOSFET and a semiconductor substrate is substantially determined by a surface breakdown voltage because the depletion layer which extends from the source or drain of the MOSFET to the semiconductor substrate is restricted by the presence of its gate electrode. For this reason, the breakdown current density at the source or drain junction becomes maximal in the proximity of the junction portion of the gate insulating film. Hence, the gate insulating film is locally heated by joule heating from the above-mentioned portion.

If the transmission gate MOSFET is short-channeled, its drain-source breakdown voltage is relatively low. The gate electrode of the transmission gate MOSFET is not connected to the grounding point of the circuit but is connected to an output terminal of a circuit such as a clock pulse generation circuit. When the surge voltage is applied to the external terminal of the IC, an undesirable potential is applied to the gate electrode of the transmission gate MOSFET via a parasitic capacitance between the gate electrode and the input electrode (drain electrode).

As a result, when the surge voltage is applied to the external terminal of the IC, not only a surface breakdown current but also a drain-source breakdown current and a channel current flow through the transmission gate MOSFET. In other words, the density of the current flowing through the transmission gate MOSFET becomes greater than that of the clamping MOSFET. The gate insulating film of the transmission gate MOSFET is heated to a relatively high temperature by the heating of the juncture portion. As a result, the gate insulating film of the transmission gate MOSFET is broken down by rapid temperature rise, thermal stress, thermal impact and the like which are generated by heating.

The breakdown of the gate insulating film of the transmission gate MOSFET may also be assumed by the following mechanism.

In general, when the drain junction of a MOSFET is broken down, a negative resistance region appears in the source-drain voltage and current characteristics. The negative resistance phenomenon may be explained as follows.

The drain region, source region and a semiconductor substrate portion encompassed by the drain and source regions of the MOSFET has the same construction as that of a bipolar lateral transistor. If the drain junction of the MOSFET is broken down by a relatively high voltage, an avalanche current generated by avalanche multiplication of the carrier is permitted to flow through the semiconductor substrate. Since the resistance of the semiconductor substrate cannot be neglected, an undesirable potential is given to the same by the avalanche current. When this potential is given to the semiconductor substrate, the source junction of the MOSFET is forwardly biased so that the minority carrier is injected from the source region into the semiconductor substrate. Hence, the drain region, the semiconductor substrate and the source region function as the collector region, the base region and the emitter region, respectively, of a parasitic bipolar lateral transistor. The minority carrier injected into the semiconductor substrate functions to regenerate the avalanche multiplication of the drain junction portion which is brought to a high field. Thus, the source junction is again forward biased by the avalanche current generated by this minority carrier.

Consequently, the breakdown of the MOSFET continues even if the drain voltage is lowered after the start of the surface breakdown.

When the abnormally high surge voltage due to frictional static electricity is applied to the external terminal, the drain voltage of the clamping MOSFET starts to rise from a value such as zero volts. When the drain voltage reaches the surface breakdown voltage, the breakdown current starts flowing through the drain junction of the clamping MOSFET. As the breakdown current starts flowing, the clamping MOSFET functions in the above-mentioned negative resistance region. As a result, the breakdown current flowing between the drain and source of the clamping MOSFET is increased by a relatively great amount.

In the drain region of the clamping MOSFET and in the semiconductor substrate portion encompassed by the drain and source regions of the MOSFET, a resistance exists which generates a voltage due to the breakdown current. Accordingly, if the level of the surge voltage applied to the external terminal is great, the drain-source voltage of the clamping MOSFET is so increased as to exceed the surface breakdown voltage notwithstanding the fact that the breakdown current is increased by the above-mentioned negative resistance phenomenon. In this case, however, a relatively large voltage drop occurs in the drain region and in the semiconductor substrate portion due to a relatively large current generated by the negative resistance phenomenon so that the voltage applied to the drain junction portion, which is in the proximity of the gate electrode and generates surface breakdown, is limited to a relatively small value. Consequently, the surface breakdown current flowing through the clamping MOSFET is reduced to a virtually negligible level as the operation due to the negative resistance phenomenon starts.

When the drain voltage of the clamping MOSFET is increased to exceed the surface breakdown voltage, the drain junction of the transmission gate MOSFET is also broken down. Due to breakdown of the drain junction, a potential is also applied to the semiconductor substrate portion near the source region of the transmission gate MOSFET. In this case, however, unlike the clamping MOSFET, the source electrode of the transmission gate MOSFET is not connected to the grounding point of the circuit, but is instead connected to an electrode such as the gate electrode of a MOSFET for signal input. This point must be carefully taken into account.

The source electrode of the transmission gate MOSFET is substantially coupled to the grounding point of the circuit in an A.C. manner merely through a parasitic element such as parasitic capacitance. The source electrode of the transmission gate MOSFET is applied with a potential higher than the grounding potential of the circuit from the semiconductor substrate portion through the source junction as well as through the source junction capacitance. The potential of the source electrode, that is, the potential of the source region, limits a forward current that would flow through the source junction. Hence, when breakdown of the drain junction starts occurring, even if a charging current with respect to the parasitic capacitance occurs due to the negative resistance phenomenon, the current is made substantially zero within a relatively short period if the capacitance is extremely small.

If the period in which the negative resistance phenomenon is induced is relatively short, or if the phenomenon does not substantially exist, the breakdown current of the transmission gate MOSFET virtually consists of the surface breakdown current.

The following can be understood from the difference in the breakdown mechanism between the clamping MOSFET and the transmission gate MOSFET.

The current generated by the negative resistance phenomenon is caused to flow through a relatively wide area of the drain junction area and can virtually be regarded as being a bulk current. Such a bulk current has a low local concentration. Due to the heating generated by the bulk current, the gate insulating film of the clamping MOSFET is heated substantially uniformly over a relatively wide range. Since the heat is diffused, the gate insulating film is not locally heated.

In contrast, the surface breakdown current flows in a concentrated manner in the surface portion of the drain junction immediately below the gate electrode. Consequently, the gate insulating film of the transmission gate MOSFET is locally heated by the heating on the surface portion of the drain junction. In this case, the gate insulating film is adversely affected by temperature, thermal stress, thermal impact and the like due to local heating. As a result, the gate insulating film of the transmission gate MOSFET is broken down, although the gate insulating film of the clamping MOSFET is not broken down.

An abnormal surge voltage such as frictional static electricity is virtually equivalent to a voltage generated from a suitable capacitance element. Accordingly, the drain voltage of the clamping MOSFET is reduced as the breakdown current is allowed to flow.

Incidentally, the effective base width of the parasitic bipolar lateral transistor formed by the MOSFET corresponds to the channel length of the MOSFET. Hence, the breakdown voltage in the negative resistance region of a short-channeled MOSFET becomes lower than that of a MOSFET whose channel length is relatively longer.

Accordingly, when the channel of the transmission gate MOSFET is reduced in comparison with that of the clamping MOSFET, it is believed that the transmission gate MOSFET is caused to temporarily exhibit the negative resistance operation before the clamping MOSFET. In other words, if the transmission gate MOSFET is short-channeled, it is believed that the transistor is pre-heated by a charging current with respect to the aforementioned parasitic capacitance before it is heated by the steady surface breakdown current. It is thus believed that the gate insulating film of the transmission gate MOSFET becomes especially easy to break down if it is short-channeled.

Referring now to the drawings, FIG. 1 is a circuit diagram of the principal portions of an embodiment of the present invention when applied to a dynamic RAM.

In FIG. 1, the circuit elements inside the portion encircled by the broken line are formed on one silicon chip by known MOS IC techniques.

External terminals represented by symbols $P_1$ through $P_5$ are disposed on the IC. Besides the circuit elements forming each circuit shown in the drawing, additional circuit elements would also be formed on the silicon chip which form a memory array consisting of plural memory cells such as 1 MOSFET/CELL, a pre-amplifier circuit, a column switch circuit, a main amplifier, a data output buffer circuit, a data input buffer circuit and the like. However, these have been omitted from the drawing for purposes of clarity in understanding the present invention. Also, although not restrictive in particular, a back bias voltage generator 50 consisting of MOSFETs is disposed on the silicon chip.

The IC is fitted to a printed circuit board in a conventional manner, and when a power source voltage is fed between the external terminals $P_4$ and $P_5$ from a power source device, the IC becomes operative. The back bias voltage generator 50 receives a positive power source voltage $V_{cc}$ via the external terminal $P_4$ and produces a back gate bia voltage to be fed to the silicon chip.

X- and Y-address signals $A_0$–$A_6$, each having a 7-bit configuration, are multiplexed and applied to a 16K-bit dynamic RAM of an address multiplex system. An address input signal $A_i$, which is one of the 7-bit address signals $A_0$–$A_6$, is applied to the external terminal $P_3$. One end of a resistor $R_1$ is connected to this external terminal $P_3$. A MOSFET $Q_1$ having the gate thereof connected to a reference potential terminal is interposed between the other end of the resistor $R_1$ and a reference potential (OV) terminal $P_5$. The resistor $R_1$ and the MOSFET $Q_1$ together form an input protective circuit. Since the gate of the MOSFET $Q_1$ is connected to the reference potential terminal to which the ground potential of the circuit is supplied, the drain junction of the MOSFET $Q_1$ has a relatively low surface breakdown voltage. Accordingly, even when a surge voltage exceeding the breakdown voltage of the gate insulating films is applied to the external terminal $P_3$, the drain voltage of the MOSFET $Q_1$ is limited to a value below the breakdown voltage.

Incidentally, the gate and source of the MOSFET $Q_1$ may be connected to the silicon chip to which the back gate bias voltage is to be supplied. According to this arrangement, the MOSFET $Q_1$ undergoes breakdown at a predetermined voltage because the silicon chip and the ground line of the circuit are kept at substantially the same potential during transportation or handling of the IC. In other words, the input protective circuit operates satisfactorily.

It is, however, preferred that the gate and source of the MOSFET $Q_1$ be connected to the grounding point as shown in the drawing for the following reason. Namely, in the circuit construction in which the back gate bias voltage is supplied to the silicon chip, the back gate bias voltage is held by capacitance such as parasitic capacitance existing between the silicon chip and various nodes of the circuit. Hence, the silicon chip is brought substantially under the floating state in a D.C. manner. When the power source is turned on, a positive potential is sometimes applied to the silicon chip via parasitic capacitance present between the silicon chip and the power source wiring. If the gate and source of the MOSFET $Q_1$ are connected to the silicon chip, the MOSFET $Q_1$ would be turned on if the silicon chip is held at a positive potential. As a result, an undesirable current would flow through a signal generation circuit (not shown) when turning on the power source via the MOSFET $Q_1$, the resistor $R_1$ and the external terminal $P_3$. On the other hand, in the circuit connection arrangement shown in FIG. 1, the gate and source of the MOSFET $Q_1$ are held at the ground potential of the circuit even when the power source is turned on so that the above-mentioned undesirable current does not occur.

One end of a resistor $R_2$ is connected to the common junction between the resistor $R_1$ and the MOSFET $Q_1$ in FIG. 1. The other end of the resistor $R_2$ is connected to the drain $E_1$ of the transmission gate MOSFET $Q_2$. Though the electrode $E_1$ of the MOSFET $Q_2$ functions either as the drain electrode or as the source electrode in accordance with the rise or fall of the signal applied to the external terminal $P_3$, the electrode will be called the "drain" in the following discussion for ease of description. The transmission gate MOSFET $Q_2$ and another MOSFET $Q_3$ connected in series with the former form a signal transmission line. A timing signal $\phi_1$ is commonly applied to the gates of these MOSFETs $Q_2$ and $Q_3$.

The address signal $A_i$ supplied to the external terminal $P_3$ is applied to an address buffer circuit via these transmission gate MOSFETs $Q_2$, $Q_3$. The level of the address signal $A_i$ is judged by the address buffer circuit. The address buffer circuit generates address signals $a_i$ and $\overline{a_i}$ of the non-inversion and inversion levels that are adjusted to suitable levels in accordance with the address signal $A_i$ supplied via the MOSFETs $Q_2$, $Q_3$. As shown in FIG. 1, the address buffer circuit consists of a MOSFET $Q_4$ and MOSFETs $Q_7$ through $Q_{16}$.

The construction and operation of the address buffer circuit will now be described. The address signal $A_i$ is applied to the gate of the MOSFET $Q_4$ via the transmission gate MOSFETs $Q_2$, $Q_3$ when the timing signal $\phi_1$ is brought to a high level. Capacitance such as gate capacitance (not shown) exists between the gate of the MOSFET $Q_4$ and the grounding point of the circuit. Hence, the gate of the MOSFET $Q_4$ holds the address signal even when the transmission gate MOSFETs $Q_2$, $Q_3$ are turned off as the timing signal $\phi_1$ is changed to the low level.

The reference voltage $V_{ref}$ for level judgement is applied to the gate of the MOSFET $Q_7$ via the transmission gate MOSFETs $Q_5$, $Q_6$. This reference voltage $V_{ref}$ is so set as to be about $\frac{1}{2}$ of the level of the signal amplitude of the address signal $A_i$ applied to the external terminal $P_3$, that is to say, a voltage level which has a virtually intermediate value between the high level and low level of the address signal $A_i$. The parasitic capacitance, which cannot be neglected, is formed between the gate electrode and source electrode and between the gate electrode and drain electrode of each of the transmission gate MOSFETs $Q_2$ and $Q_3$. Hence, an undesirable change in the potential that can be regarded as noise is applied to the gate electrode of the MOSFET $Q_4$ in synchronism with the rise and fall of the timing signal. The transmission gate MOSFETs $Q_5$ and $Q_6$ are disposed in order to apply a potential change to the gate of the MOSFET $Q_7$ having substantially the same potential change that is applied to the gate of the MOSFET $Q_4$. Since such a potential change is applied to the gate of the MOSFET $Q_7$, the level of the address signal $A_i$ can be judged suitably even if the gate potential of the MOSFET $Q_4$ fluctuates.

MOSFETs $Q_8$ and $Q_9$ are connected in parallel to the MOSFETs $Q_4$ and $Q_7$, respectively. The drains and gates of these MOSFETs $Q_8$ and $Q_9$ are cross-connected in order to form a latch circuit.

The drains of MOSFETs $Q_{12}$ and $Q_{13}$, which serve as a load, are connected to the commonly connected drains of the MOSFETs $Q_4$, $Q_8$ and to the commonly connected drains of the MOSFETs $Q_7$, $Q_9$, respectively. A timing signal $\phi_{PA}$ is supplied to the drains of the MOSFETs $Q_{12}$ and $Q_{13}$.

The sources of MOSFETs $Q_{14}$ and $Q_{15}$, which are subjected to the switching control by the timing signal $\phi_1$, are connected to the gates of the MOSFETs $Q_{12}$ and $Q_{13}$, respectively. A MOSFET $Q_{16}$, which is subjected to the switching control by the timing signal $\phi_1$, is interposed between the commonly connected drains of the MOSFETs $Q_{14}$, $Q_{15}$ and the power source terminal $V_{cc}$. When the timing signal $\phi$ is changed to the high level, therefore, pre-charge voltages are supplied to the gates of the MOSFETs $Q_{12}$ and $Q_{13}$ via the MOSFETs $Q_{16}$, $Q_{14}$ and $Q_{15}$, respectively.

MOSFETs $Q_{10}$ and $Q_{11}$ are inserted between the gates of the MOSFETs $Q_{12}$, $Q_{13}$ and the reference potential terminal, respectively. A positive feedback signal is supplied to the gate of the MOSFET $Q_{12}$ because the gate of the MOSFET $Q_{10}$ is commonly connected to that of the MOSFET $Q_8$. Similarly, a positive feedback signal is supplied to the gate of the MOSFET $Q_{13}$ because the gate of the MOSFET $Q_{11}$ is connected in common to that of the MOSFET $Q_9$. Address buffer output signals $a_i$ and $\overline{a_i}$ of the non-inversion and inversion levels are generated from the drains of the MOSFETs $Q_{11}$ and $Q_{10}$, respectively.

The address buffer output signals $a_i$ and $\overline{a_i}$ are applied to the amplifier circuit 2. The signals of the non-inversion and inversion levels amplified by the amplifier circuit 2 are supplied to an X address decoder 3 via the transmission gate MOSFETs $Q_{17}$ and $Q_{18}$ that are subjected to the switching control by the timing signal $\phi_x$, respectively, and, on the other hand, they are directly supplied to a Y address decoder 4. A MOSFET $Q_{19}$, which acts as a power switch that is subjected to the switching control by the timing signal $\overline{\phi_y}$, is disposed in the Y address decoder 4.

As described already, the X address signal and the Y address signal are multiplexed and applied to the external terminal $P_3$. When the X address signal is supplied to the external terminal $P_3$, the timing signals $\phi_x$ and $\overline{\phi_y}$ are changed to the high and low levels, respectively, in synchronism with the application of the X address signal, so that the transmission gate MOSFETs $Q_{17}$, $Q_{18}$ are turned on and the address signal is supplied to the X address decoder. When the Y address signal is supplied to the external terminal $P_3$, the transmission gate MOSFETs $Q_{17}$ and $Q_{18}$ are turned off by the timing signals $\phi_x$ and $\overline{\phi_y}$ while the power switch MOSFET $Q_{19}$ is turned on. As a result, the Y address decoder is brought under the operative state.

The timing pulse generation circuit 1 shown in FIG. 1 generates the timing signals $\phi_1$, $\phi_{PA}$ and the like upon receiving an X address (row address) selection signal $\overline{RAS}$ and a Y address (column address) selection signal $\overline{CAS}$ via the external terminals $P_1$ and $P_2$, respectively.

The operation of the address buffer circuit will be described by referring to the waveform chart of FIG. 2.

The address signal $A_i$ applied in synchronism with the X address selection signal $\overline{RAS}$ is transmitted to the gate of the MOSFET $Q_4$ through the transmission gate MOSFETs $Q_2$, $Q_3$ that are turned on as the timing signal $\phi_1$ becomes high level. The timing signal $\phi_1$ is changed to its low level after the passage of a predetermined period from the time when the X address selection signal $\overline{RAS}$ is changed to the low level. The MOSFETs $Q_2$ and $Q_3$ are turned off as the timing signal $\phi_1$ is changed to its low level. The address signal $A_i$ is held by the gate capacitance of the MOSFET $Q_4$. Since the transmission gate MOSFETs $Q_2$ and $Q_3$ are kept off, the address signal held by the gate of the MOSFET $Q_4$ remains unchanged even if the address signal $A_i$ is changed.

During the period in which the timing signal $\phi_1$ is kept at the high level, the MOSFETs $Q_{14}$, $Q_{15}$ and $Q_{16}$ are kept on. For this reason, the gates of the MOSFETs $Q_{12}$ and $Q_{13}$ are pre-charged via the MOSFETs $Q_{14}$, $Q_{15}$ and $Q_{16}$.

The timing signal $\phi_{P4}$ is changed to the high level after the passage of a predetermined delay time from the point when the X address selection signal $\overline{RAS}$ is changed to the selection level (low level).

If the address signal $A_i$ supplied to the gate of the MOSFET $Q_4$ is set in advance to a higher level than the reference voltage $V_{ref}$ supplied to the gate of the MOSFET $Q_7$, the conductance of the MOSFET $Q_4$ becomes greater than that of the MOSFET $Q_7$. Hence, the gate potentials of the MOSFETs $Q_8$ and $Q_9$ become higher than those of the MOSFETs $Q_9$ and $Q_{11}$ in response to the rise of the timing signal $\phi_{P4}$ to the high level. The MOSFETs $Q_8$ and $Q_{10}$ are so controlled as to be turned on in accordance with the difference of the gate potentials while the MOSFETs $Q_9$ and $Q_{11}$ are turned off. When the MOSFET $Q_{10}$ is turned on, the charge that is applied in advance to the gate capacitance of the MOSFET $Q_{12}$ is discharged so that the MOSFET $Q_{12}$ is turned off.

Due to the above-mentioned positive feedback operation, the output signals $a_i$ and $\overline{a_i}$ are rapidly changed to their low and high levels, respectively. The output signals $\overline{a_i}$ and $a_i$ are supplied to the X address decoder circuit 3 via the amplifier circuit 2 and the transmission gate MOSFETs $Q_{17}$ and $Q_{18}$. Thereafter, the timing signal $\phi_1$ is again changed to high level. The input operation of the Y address signal $A_i$ is started when the Y address selection signal $\overline{CAS}$ is changed to the selection level (low level). Namely, the address signal $A_i$ which is applied in synchronism with the Y address selection signal $\overline{CAS}$ is likewise taken into the Y address decoder circuit 4.

In accordance with this embodiment, since the address signal $A_i$ is supplied to and held by the gate capacitance of the input MOSFET $Q_4$ via the MOSFETs $Q_2$ and $Q_3$, it is possible to feed an address signal which is to be next supplied to the external terminal $P_3$ even before the operation of the address buffer circuit is finished. As a result, the speed of the circuit operation can be increased.

In the circuit shown in FIG. 1, two series-connected MOSFETs $Q_2$ and $Q_3$ are disposed. These MOSFETs $Q_2$ and $Q_3$ operate in such a manner as to prevent the high level signal held by the gate capacitance of the MOSFET $Q_4$ from being extinguished by under-shoot or the like of the address signal applied to the external terminal $P_3$. Specifically, in a case in which only one MOSFET is employed, if the external terminal $P_3$ is brought to the negative potential due to under-shoot of the address signal $A_i$, the drain electrode (which functions as the source electrode in this case) of the transmission gate MOSFET is also changed to the negative potential in response thereto. Hence, the transmission gate MOSFET would be turned on in spite of the fact that its gate electrode is kept at a low level substantially equal to the ground potential by the timing signal $\phi_1$. As a result, the charge held by the gate of the input MOSFET $Q_4$ would be discharged through the transmission gate MOSFET.

On the other hand, in the above-mentioned embodiment which uses the two transmission gate MOSFETs $Q_2$ and $Q_3$, even if under-shoot occurs in the address signal $A_i$ applied to the external terminal $P_3$, the MOSFET $Q_3$ is turned on only after the high level potential held by the parasitic capacitance (not shown) of the common junction between the MOSFETs $Q_2$ and $Q_3$ is discharged through the MOSFET $Q_2$. Hence, it is possible to prevent the high level address signal held by the gate capacitance of the MOSFET $Q_4$ from being extinguished. Accordingly, although the present invention is not limited to the use of two transmission gate MOSFETs, it is often preferable to use two to prevent extinguishment of an address signal.

Since the transmission gate MOSFETs $Q_2$ and $Q_3$ form the signal transmission line, they are constructed in the short channel arrangement and their size is relatively reduced in order to increase the signal transmission speed. In other words, the parasitic capacitance in the signal transmission line is reduced. The speed of rise and fall of the timing signal $\phi_1$ can also be increased by reducing the gate capacitance of the transmission gate MOSFETs. Furthermore, these MOSFETs are formed with a short channel arrangement so as to exhibit a relatively low on-resistance characteristic when the size is reduced as described above.

In the circuit of FIG. 1, the resistor $R_2$ is very important since the transmission gate MOSFET $Q_2$ of this type cannot be protected from a surge voltage that is unavoidably applied to the external terminal $P_3$ by the circuit if the resistor $R_2$ is removed from the input protective circuit. In other words, a protective circuit consisting only of the resistor $R_1$ and the diode-connection MOSFET $Q_1$ is insufficient. Specifically, as the MOSFET $Q_2$ is short-channeled, the breakdown voltage between its drain and source is relatively lowered. When the surge voltage is applied to the drain of the MOSFET $Q_2$, its gate potential is changed via the parasitic capacitance. The breakdown of the transmission gate MOSFET is effected in the above-mentioned mechanism. Accordingly, the current density becomes locally great at the breakdown portion of the transmission gate MOSFET $Q_2$, and there is an extremely high possibility that the gate insulating film of the transistor will be thermally destroyed. By contrast, since the MOSFET $Q_1$ is not in the transmission line, its size, such as its channel length (gate length) can be increased so that the transistor has a relatively high drain-to-source breakdown voltage, and its breakdown mechanism is different from that of the transmission gate MOSFET $Q_2$. Accordingly, even if the clamp MOSFET $Q_1$ is broken down by an abnormally high voltage accidentally applied to the external terminal $P_3$, its gate insulating film is not thermally destroyed because the current density is reduced.

Therefore, in accordance with the present invention, the resistor $R_2$ is inserted between the drain of the clamp MOSFET $Q_1$ and that of the transmission gate MOSFET $Q_2$. Since the resistor $R_2$ is inserted, the level of the high voltage that is accidentally applied to the drain of the transmission gate MOSFET $Q_2$ is reduced so that surface breakdown on the interface of the gate portion of the transmission gate MOSFET $Q_2$ and the substrate becomes difficult. Even when breakdown occurs in the transmission gate MOSFET $Q_2$, the breakdown current is restricted by the resistor $R_2$. Thus, the breakdown of the gate insulating film of the transmission gate MOSFET $Q_2$ can be prevented by these double protecting actions.

In an IC, if a MOSFET connected to any one of a plurality of external terminals for receiving the signal input is broken down, the IC as a whole can no longer be used. To eliminate this problem, an input protective circuit containing the above-mentioned resistor $R_2$ is connected to each of the transmission gate MOSFETs connected to the plural external terminals for receiving the signal input. Similarly, an input protective circuit consisting of the resistor $R_1$ and the MOSFET $Q_1$ is connected to each of the signal input MOSFETs which have the signals supplied to the external terminals directly applied to their gates without passing through the transmission gate MOSFETs.

Figure 3:
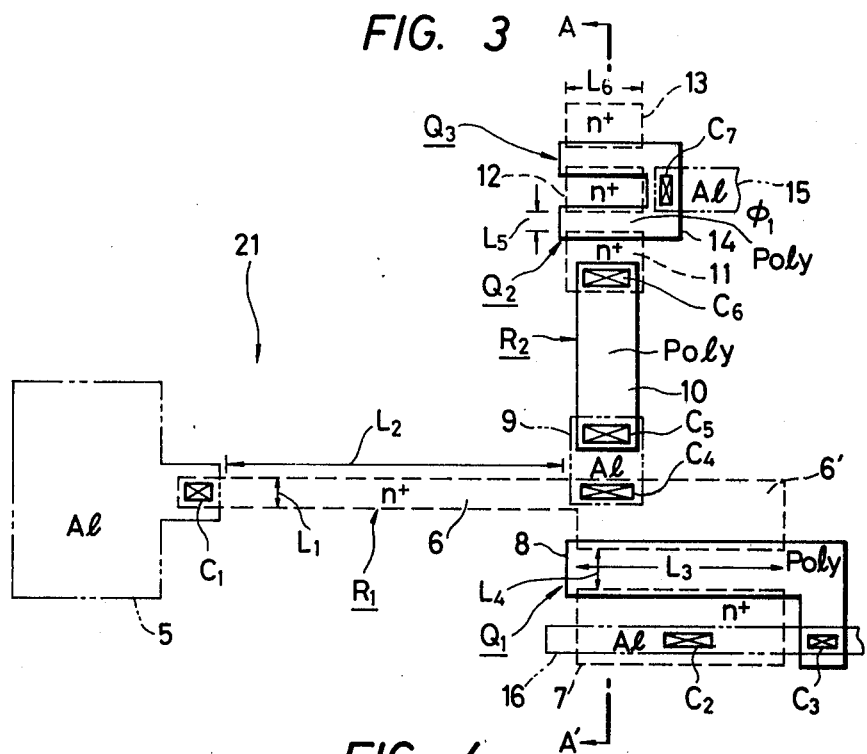
FIG. 3 is a diagram showing the layout of each element forming the circuit of the embodiment of the present invention.

FIG. 3 shows the layout pattern of each of the resistors $R_1$, $R_2$ and MOSFETs $Q_1$ through $Q_3$ forming the circuit shown in FIG. 1. In the drawing, an electroconductive polysilicon layer, an n+ semiconductor region and a vacuum deposition aluminum layer are represented by a solid pattern, a broken line pattern and a two-dot chain line pattern, respectively.

Figure 4:
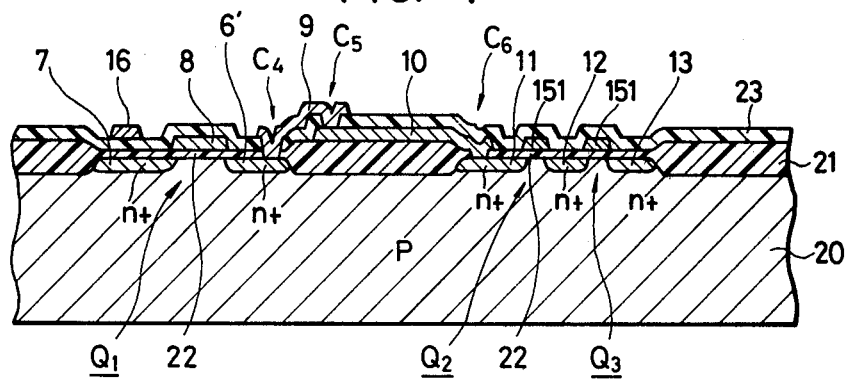
FIG. 4 is a sectional view taken along line A—A' of FIG. 3.

FIG. 4 shows the section of the semiconductor substrate corresponding to the portion along line A—A' of FIG. 3. The semiconductor substrate 20 can have a resistivity of approximately 10 Ohm-cm, although this value is not restrictive, and it is formed by a p-type single crystal silicon arranged so that the main surface is parallel to the (100) plane. A relatively thick field oxide film 21 having a thickness of about 0.8 μm, for example, is formed by a known selective oxidation technique on the main surface of the semiconductor substate 20 at portions other than those at which active regions such as the source and drain regions of the MOSFETs, the channel-forming regions, the semiconductor wiring regions and the semiconductor resistor regions are to be formed. A relatively thin silicon oxide film 22 about 500 Å thick, for example, which film 22 is to be used as the gate insulating film of the MOSFET, is formed on the main surface of the semiconductor substrate 20 at the portions which are to serve as the active regions. Polysilicon layers 8 and 10 about 3500 Å thick are formed on the surfaces of the oxide film 22 and field oxide film 21. n+ semiconductor regions 6', 7, 11, 12 and 13, each having a thickness of about 0.4 μm, are formed on the main surface of the semiconductor substrate 20 by the known self-alignment technique using the polysilicon layers 8, 10 and the field oxide film 21 as the impurity implantation masks. Arsenic ions at an energy of 80 KeV, for example, can be implanted into the main surface of the semiconductor substrate 20 to an impurity concentration of $1 \times 10^{16}/cm^2$ by known ion implantation techniques in order to form an n+ semiconductor region, and the semiconductor substrate 20 is then annealed at a temperature of 1,000° C. An approximately 6000 Å thick insulating film 23 consisting of phosphosilicate glass is formed on the surfaces of the field oxide film 21 and the polysilicon layers 7 and 7'. Vacuum deposition aluminum layers 9 and 16 having a thickness of approximately 8000 Å are formed on the surface of the insulating film 23.

In FIG. 3, the aluminum layer 5 formed on the field oxide film 21 via the insulating film 23 is used as a bonding pad. This bonding pad is connected to leads (not shown) of the IC via contact wires made of gold or the like. The aluminum layer 5 is brought into non-rectifying contact with one end of the n+ semiconductor region 6 at a contact portion $C_1$ consisting of a through-hole formed by the insulating film 23 and the oxide film 22 below the insulating film 23.

The n+ semiconductor region 6 is shaped in an elongated pattern so as to form the resistance element $R_1$. The other end of the n+ semiconductor region 6 is connected to the n+ semiconductor region 6' which is to serve as the drain region of the clamp MOSFET $Q_1$.

The source region of the clamp MOSFET $Q_1$ is formed by an n+ semiconductor region 7 opposing the n+ semiconductor region 6'. On the surface of the semiconductor substrate 20 between these n+ semiconductor regions 6' and 7 is formed a gate electrode consisting of an electrically conductive polysilicon layer 8 which is separated from the substrate 20 by the oxide film 22.

The n+ semiconductor region 7, which serves as the source region, and the electroconductive polysilicon layer 8, which serves as the gate electrode, are connected to the aluminum wiring layer 16 via contact portions $C_2$ and $C_3$, respectively. The aluminum wiring layer 16 is interconnected to the bonding pad (not shown) to which the ground potential of the circuit is applied.

In FIG. 3, the electroconductive polysilicon layer 10 forms the resistance element $R_2$. Though not limited to this in particular, the other end of the n+ semiconductor region 6 serving as the resistor $R_1$ and one end of the electroconductive polysilicon layer 10 serving as the resistor $R_2$ are connected to each other via the aluminum layer 9. The other end of the electroconductive polysilicon layer 10 is connected to an n+ semiconductor region 11 at a contact portion $C_6$. This semiconductor region 11 forms the drain region of the transmission gate MOSFET $Q_2$.

An n+ semiconductor region 12 forms the source region and drain region of the transmission gate MOSFETs $Q_2$ and $Q_3$, respectively, while an n+ semiconductor region 13 forms the source region of the transmission gate MOSFET $Q_3$. The electroconductive polysilicon layer 14 forms the gate electrodes of the MOSFETs $Q_2$ and $Q_3$ and is connected to the aluminum layer 15, to which the timing signal $\phi$ is applied, at a contact portion $C_7$. The semiconductor region 13, which serves as the source region of the MOSFET $Q_3$, is connected to the gate of the MOSFET $Q_4$ via an aluminum layer (not shown).

The n+ semiconductor region 6 has a relatively large resistance in order to substantially restrict the peak value of a voltage that is inevitably applied to the MOSFET $Q_1$ when the abnormal surge voltage is applied to the external terminal $P_3$ (see FIG. 1) and to restrict the breakdown current flowing through the clamp MOSFET $Q_1$. The n+ semiconductor region 6 also has a relatively large parasitic capacitance between it and the semiconductor substrate 20 in order to reduce the peak value of the surge voltage applied to the clamping MOSFET $Q_1$.

The n+ semiconductor region 6 has a length of about 100 μm, and a width $L_1$ of about 5 μm, for example, though the values are not restrictive, in particular. The diffusion depth can be about 0.4 μm, as described already. Hence, the n+ semiconductor region 6 has a resistance of about 700 Ohms and parasitic capacitance of 0.1 to 0.2 pF.

The clamping MOSFET $Q_1$ has a relatively large size in order to prevent thermal breakdown of the gate insulating film by reducing the breakdown current density flowing therethrough. The channel length $L_4$ of this transistor $Q_1$ is about 8 μm while its channel width $L_3$ is about 40 μm, for example.

The electroconductive polysilicon layer 10, which serves as the resistor $R_2$, reduces the level of the current that is inevitably applied to the transmission gate MOSFET $Q_2$ when the abnormal surge voltage is impressed upon the external terminal $P_3$ (see FIG. 1). The electroconductive polysilicon layer 10 has a resistance of about 500 Ohms.

In order to increase the signal transmission speed, the transmission gate MOSFETs $Q_2$ and $Q_3$ have a relatively small size. These transistors $Q_2$ and $Q_3$ have a channel length $L_5$ of about 3.5 μm and a channel width $L_6$ of about 15 μm, for example. Thus, the size of the transmission gate MOSFETs $Q_2$ and $Q_3$ is remarkably smaller than that of the protective MOSFET $Q_1$. If the same breakdown current is assumed to flow through the transmission gate MOSFET $Q_2$ and the clamping MOSFET $Q_1$, the current density of the former is considerably greater than that of the latter. In this case, thermal breakdown of the gate insulating film of the transmission gate MOSFET $Q_2$ is likely to occur.

The MOSFET $Q_1$, which serves as the protective element to perform the clamping action in this embodiment, has substantially the same surface breakdown voltage as that of the transmission gate MOSFETs since it is formed simultaneously with the latter. When the gate voltage is 0 volts, the drains of the clamping MOSFET $Q_1$ and the transmission gate MOSFET $Q_2$ have a surface breakdown voltage of about 20 V, respectively. The breakdown voltage of a pn junction which does not involve the surface breakdown, such as the pn junction between the semiconductor region and the semiconductor substrate, is from 37 to 40 V.

The 500 Å gate oxide film has an electrostatic breakdown withstand voltage of 30 to 40 V.

Since the transmission gate MOSFET is short-channeled, it has only a relatively low drain-source breakdown voltage. Namely, when the semiconductor substrate having the above-mentioned resistivity is used, the drain-source breakdown voltage of the transmission gate MOSFET having a 3.5 μm channel length is about 11 V. This breakdown voltage value is the minimum breakdown voltage of the MOSFET, that is, the minimum value of the breakdown voltages measured from the negative resistance curve of the MOSFET. The drain-source breakdown voltage of the clamping MOSFET having an 8 μm channel length is about 16 V.

In accordance with this embodiment, since the resistor $R_2$ is inserted, the breakdown current of the transmission gate MOSFET $Q_2$ is limited so that the breakdown of the gate insulating film of this transistor $Q_2$ can be prevented.

In accordance with the embodiment shown in FIG. 3, since the resistance element $R_2$ is formed by the polysilicon layer deposited on the field oxide film 21, it has only a relatively small parasitic capacitance between it and the semiconductor substrate 20. Hence, the resistance element $R_2$ does not substantially limit the signal change speed of the signal supplied to the transmission gate MOSFET $Q_2$.

Figure 5:
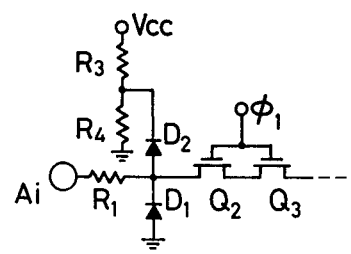
FIG. 5 is a circuit diagram showing another embodiment of the present invention.

FIG. 5 shows another embodiment of the present invention. In this embodiment, a backward diode $D_1$ is disposed in place of the clamping MOSFET $Q_1$ of the foregoing embodiment. The breakdown voltage of this diode $D_1$ is so set as to be lower than that (about 20 V) of the transmission gate MOSFET $Q_2$ but higher than the signal amplitude (about 5 V) of the address signal $A_i$.

According to this arrangement, the transmission gate MOSFET $Q_2$ does not undergo breakdown even when an abnormally high voltage is applied to the external terminal. Hence, breakdown of the MOSFET $Q_2$ can be reliably prevented.

In this embodiment, a forward diode $D_2$ is interposed between the other end of the resistor $R_1$ and the junction of resistors $R_3$ and $R_4$ that divide the power source voltage $V_{cc}$ and have relatively high resistance values, respectively. The voltage-division output by these resistors $R_3$, $R_4$ is set near the power source voltage $V_{cc}$.

When the power source voltage $V_{cc}$ is supplied, the diode $D_2$ is reversely biased by the voltage-division output voltage from the high resistors $R_3$ and $R_4$. The diode $D_2$ is also biased reversely by the input signal $A_i$. Hence, the diodes $D_1$ and $D_2$ do not affect the transmission of the ordinary input signal $A_i$ at all.

On the other hand, when the power source voltage $V_{cc}$ is not applied, the clamping operation is effected via the route of the diode $D_2$ and the resistor $R_4$ if a high voltage due to static electricity is applied. Accordingly, as the diode $D_2$ is turned on together with the diode $D_1$, the high voltage due to static electricity can be strongly restricted.

The present invention is not limited to the foregoing embodiments. For example, the present invention can also be used with a single transmission gate MOSFET if desired. In FIGS. 1 through 3, since the surge voltage is limited to below the breakdown voltage of the gate insulating film by the clamping MOSFET $Q_1$, the resistor $R_2$ is preferably so constructed as not to limit the change speed of the signal. Namely, it is preferred that the resistor $R_2$ is so constructed as to reduce the parasitic capacitance between it and the semiconductor substrate in the same way as the aforementioned polysilicon layer. If necessary, however, the resistor $R_2$ may be formed by a semiconductor resistor layer such as a diffusion resistor.

Preferably, the resistor $R_1$ is constructed by a semiconductor resistor region having a large parasitic capacitance in order to sufficiently restrict the peak value of the surge voltage applied to the MOSFET $Q_1$. If necessary, however, it may be formed on the field oxide film in the same way as the resistor $R_1$. In such a case, an advantage can be obtained in that the withstand voltage between the resistor $R_1$ and the semiconductor substrate can be increased to a marked extent.

Figure 2:
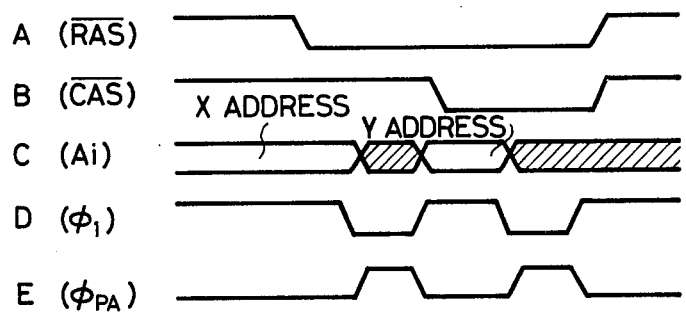
FIG. 2 is a timing chart of the circuit shown in FIG. 1.

The protective element such as the MOSFET $Q_1$ shown in FIGS. 2 and 3 may have a channel length which is equal to, or shorter than, the channel length of the transmission gate MOSFET. In such a case, if an abnormal surge voltage is applied to the external terminal, the level of the surge voltage which is applied to the transmission gate MOSFET is limited to a relatively low value. For this reason, the resistance of the resistance element $R_2$, which is connected in series with the transmission gate MOSFET $Q_2$ to limit the breakdown current, can be reduced.

The polysilicon layer 10 shown in FIG. 3 may be connected to the drain region 11 of the MOSFET $Q_2$ via a conductor layer such as a vacuum deposition aluminum layer. The polysilicon layer 10 may also be connected directly to the drain region 6' of the MOSFET $Q_1$ without passing through the vacuum deposition aluminum layer 9.

When the protective circuit consisting of the resistor $R_1$ and the clamping MOSFET $Q_1$ is used as in the foregoing embodiments, the resistor $R_2$ for restricting the breakdown current can be limited to a relatively small value. As a result, the drop of the signal change speed due to the resistor $R_2$ under the operating state of the IC can be made relatively small.

However, when the resistance of the resistor $R_2$ can be made relatively large, the protective circuit consisting of the resistor $R_1$ and the clamping MOSFET $Q_1$ is not always necessary. In such a case, when the abnormal surface voltage is applied to the external terminal $P_3$, the voltage applied to the drain of the transmission gate MOSFET $Q_2$ is limited by the surface breakdown voltage.

The present invention can be widely used in a semiconductor integrated circuit device having the aforementioned so-called "drain input" system.

It is to be understood that the above-described arrangements are simply illustrative of the application of the principles of this invention. Numerous other arrangements may be readily devised by those skilled in the art which embody the principles of the invention and fall within its spirit and scope.

We claim:

1. A semiconductor integrated circuit device comprising:
    an external terminal to which an input signal is applied;
    a first circuit node;
    an insulated gate field effect transistor coupled to said external terminal and said first circuit node for transmitting the input signal applied to said external terminal via a drain-source path thereof to said first circuit node, a gate of said first insulated gate field effect transistor being connected to an output terminal of a pulse generator circuit generating a switch signal;
    a resistance element inserted between said external terminal and said insulated gate field effect transistor; and
    an input circuit coupled to the first circuit node to receive said input signal transmitted to said first input circuit node via said drainsource path of said insulated gate field effect transistor,
    wherein said resistance element has a resistance value so set that when an abnormal surge voltage having a voltage level greater than a normal predetermined input signal voltage level is applied to said external terminal, said resistance element reduces a breakdown current flowing through a semiconductor junction of said insulated gate field effect transistor to a level lower than a breakdown current level that causes breakdown of a gate insulating film of said insulated gate field effect transistor.

2. The semiconductor integrated circuit device as defined in claim 1, wherein said first circuit node is comprised of a gate electrode of an insulated gate field effect transistor which constitutes said input circuit.

3. A semiconductor integrated circuit device comprising:
    an external terminal to which an input signal is applied;
    a first circuit node;
    a second circuit node;
    a protective circuit coupled between said first circuit node and said external terminal to transmit the input signal supplied to said external terminal to said first circuit node, said protective circuit operating to restrict a maximum level of a voltage applied to said first circuit node to a predetermined level;
    a first resistance element having one end thereof connected to said first circuit node;
    a first insulated gate field effect transistor coupled to another end of said first resistance element and to said second circuit node, said first insulated gate field effect transistor supplying a signal supplied to said another end of said first resistance element via a drain-source path thereof to said second circuit node, a gate of said first insulated gate field effect transistor being connected to an output terminal of a pulse generator circuit generating a switch signal;
    an input circuit coupled to the second circuit node to receive said signal supplied to said second node via said drain-source path of said first insulated gate field effect transistor,
    wherein said first resistance element has a resistance value set so that when an abnormal surge voltage having a voltage level greater than a normal predetermined input signal voltage level is applied to said external terminal, said first resistance element reduces a breakdown current flowing through a semiconductor junction of said first insulated gate field effect transistor to a level lower than a breakdown current level that causes breakdown of a gate insulating film of said first insulated gate field effect transistor, and
    further wherein the gate insulating film of said first insulated gate field effect transistor has a breakdown withstand voltage greater than the predetermined level to which said protective circuit restricts the maximum voltage at said first circuit node.

4. The semiconductor integrated circuit device as defined in claim 3, wherein said second circuit node is comprised of a gate electrode of an insulated gate field effect transistor which constitutes said input circuit.

5. The semiconductor integrated circuit device as defined in claim 3, wherein said protective circuit is comprised of a second resistance element inserted between said external terminal and said first circuit node and a protective element substantially connected between said first circuit node and a reference potential point of said circuit which protective element has a breakdown voltage of a value lower than the breakdown voltage of the gate insulating film of said first insulated gate field effect transistor.

6. The semiconductor integrated circuit device as defined in claim 5, wherein said first resistance element is comprised of a resistor layer formed, via an insulating film, on a semiconductor substrate having formed on a surface thereof drain and source regions of said first insulated gate field effect transistor, and said second resistance element is comprised of a semiconductor region forming a p-n junction between said semiconductor region and said semiconductor substrate.

7. The semiconductor integrated circuit device as defined in claim 6, wherein the gate electrode of said first insulated gate field effect transistor and said first resistance element are formed by a polysilicon layer.

8. The semiconductor integrated circuit device as defined in claim 5, wherein said protective element is comprised of a second insulated gate field effect transistor having a drain thereof connected to said first conduit node and a source thereof connected to said reference potential point.

9. The semiconductor integrated circuit device as defined in claim 8, wherein said first insulated gate field effect transistor has a size smaller than that of said second insulated gate field effect transistor.

10. The semiconductor integrated circuit device as defined in claim 8, wherein said first insulated gate field effect transistor has a channel length shorter than that of said second gate insulated field effect transistor.

11. A semiconductor integrated circuit device including plural external terminals to which an input signal is supplied, plural first circuit nodes, plural insulated gate field effect transistors coupled to said external terminals and to said plural first circuit nodes for transmitting said input signal applied to each of said plural external terminals through drain-source paths to said plural first circuit nodes, and plural input circuits coupled to said plural first circuit nodes to receive said input signals transmitted to said plural first circuit nodes through said drain-source paths, wherein each gate of said insulated gate field effect transistors is connected to an output terminal of a pulse generator circuit generating switch signals, and further wherein said input signal is applied to each of said plural insulated gate field effect transistors via a protective circuit including means for limiting a voltage level below a predetermined level and a resistance element connected between said protective circuit and said insulated gate field effect transistors for limiting current applied to said insulated gate field effect transistors.

12. A semiconductor integrated circuit device comprising:
an external terminal;
first and second circuit nodes;
a resistance element connected between said external terminal and said first circuit node;
a protective element connected between said first circuit node and a reference potential point;
an insulated gate field effect transistor having a drain-source path thereof connected between said first and second circuit nodes and receiving a switch signal at a gate thereof; and
an input circuit coupled to said second circuit node to receive a signal supplied to said second circuit node through a drain-source path of said insulated gate field effect transistor,
wherein said protective element has such a breakdown voltage as to restrict the voltage level appearing at said first circuit node when an abnormal surge voltage having a voltage level greater than a normal predetermined input signal voltage level is applied to said external terminal to a value lower than a breakdown voltage of the semiconductor junction of said insulated gate field effect transistor.

13. The semiconductor integrated circuit device as defined in claim 12 wherein said protective element is comprised of a diode having a cathode coupled to said first circuit node and an anode coupled to said reference potential point.

14. A semiconductor integrated circuit device comprising:
an external terminal to which an input signal is applied;
a first circuit node;
a first insulated gate field effect transistor;
second and third insulated gate field effect transistors coupled with their drain-source paths in series between said external terminal and a gate of said first insulated gate field effect transistor for transmitting the input signal applied to said external terminal via said drain-source paths thereof to said first circuit node; and
a resistance element inserted between said external terminal and said second insulated gate field effect transistor,
wherein said resistance element has a resistance value so set that when an abnormal surge voltage having a voltage level greater than a normal predetermined input signal voltage level is applied to said external terminal, said resistance element reduces a breakdown current flowing through semiconductor junctions of said second and third insulated gate field effect transistors to a level lower than a breakdown current level that causes breakdown of gate insulating films of said second and third insulated gate field effect transistors.

15. A semiconductor integrated circuit device comprising:
an external terminal to which an input signal is applied;
a first and a second circuit node;
a first insulated gate field effect transistor;
a protective circuit coupled between said first circuit node and said external terminal to transmit the input signal supplied to said external terminal to said first circuit node, said protective circuit operating to restrict a maximum level of a voltage applied to said first circuit node to a predetermined level;
a first resistance element having one end thereof connected to said first circuit node; and
second and third insulated gate field effect transistors coupled with their drain-source paths in series between another end of said first resistance element and a gate of said first insulated gate field effect transistor, said second and third insulated gate field effect transistors supplying a signal supplied to said another end of said first resistance element via a drain-source path thereof to said second circuit node,
wherein said first resistance element has a resistance value set so that when an abnormal surge voltage having a voltage level greater than a normal predetermined input signal voltage level is applied to said external terminal, said first resistance element reduces a breakdown current flowing through semiconductor junctions of said second and third insulated gate field effect transistors to a level lower than a breakdown current level that causes breakdown of gate insulating films of said second and third insulated gate field effect transistors, and
further wherein the gate insulating films of said second and third insulated gate field effect transistors have a breakdown withstand voltage greater than the predetermined level to which said protective circuit restricts the maximum voltage at said first circuit node.

16. A semiconductor integrated circuit device comprising:
an external terminal to which an input signal is applied;
a first circuit node;
a second circuit node;
a protective circuit coupled between said first circuit node and said external terminal to transmit the input signal supplied to said external terminal to said first circuit node, said protective circuit operating to restrict a maximum level of a voltage applied to said first circuit node to a predetermined level;

a first resistance element having one end thereof connected to said first circuit node; and a first insulated gate field effect transistor coupled to another end of said first resistance element and to said second circuit node, said first insulated gate field effect transistor supplying a signal supplied to said another end of said first resistance element via a drain-source path thereof to said second circuit node, wherein said first resistance element has a resistance value set so that when an abnormal surge voltage having a voltage level greater than a normal predetermined input signal voltage level is applied to said external terminal, said first resistance element reduces a breakdown current flowing through a semiconductor junction of said first insulated gate field effect transistor to a level lower than a breakdown current level that causes breakdown of a gate insulating film of said first insulated gate field effect rransistor, wherein the gate insulating film of said first insulated gate field effect transistor has a breakdown withstand voltage greater than the predetermined level to which said protective circuit restricts the maximum voltage at said first circuit node, and further wherein said second circuit node is comprised of a gate electrode of an insulated gate field effect transistor for signal input.

17. A semiconductor integrated circuit device comprising:

an external terminal to which an input signal is applied;

a first circuit node;

a second circuit node;

a protective circuit coupled between said first circuit node and said external terminal to transmit the input signal supplied to said external terminal to said first circuit node, said protective circuit operating to restrict a maximum level of a voltage applied to said first circuit node to a predetermined level;

a first resistance element having one end thereof connected to said first circuit node; and a first insulated gate field effect transistor coupled to another end of said first resistance element and to said second circuit node, said first insulated gate field effect transistor supplying a signal supplied to said another end of said first resistance element via a drain-source path thereof to said second circuit node;

wherein said first resistance element has a resistance value set so that when an abnormal surge voltage having a voltage level greater than a normal predetermined input signal voltage level is applied to said external terminal, said first resistance element reduces a breakdown current flowing through a semiconductor junction of said first insulated gate field effect transistor to a level lower than a breakdown current level that causes breakdown of a gate insulating film of said first insulated gate field effect transistor, wherein the gate insulating film of said first insulated gate field effect transistor has a breakdown withstand voltage greater than the predetermined level to which said protective circuit restricts the maximum voltage at said first circuit node, and further wherein said protective circuit is comprised of a second resistance element inserted between said external terminal and said first circuit node and a protective element substantially connected between said first circuit node and a reference potential point of said circuit which protective element has a breakdown voltage of a value lower than the breakdown voltage of the gate insulating film of said first insulated gate field effect transistor.

18. The semiconductor integrated circuit device as defined in claim 17, wherein said first resistance element is comprised of a resistor layer formed, via an insulating film, on a semiconductor substrate having formed on a surface thereof drain and source regions of said first insulated gate field effect transistor, and said second resistance element is comprised of a semiconductor region forming a p-n function between said semiconductor region and said semiconductor substrate.

19. The semiconductor integrated circuit device as defined in claim 18, wherein the gate electrode of said first insulated gate field effect transistor and said first resistance element are formed by a polysilicon layer.

20. The semiconductor integrated circuit device as defined in claim 17, wherein said protective element is comprised of a second insulated gate field effect transistor having a drain thereof connected to said first circuit node and a source thereof connected to said reference potential point.

21. The semiconductor integrated circuit device as defined in claim 20, wherein said first insulated gate field effect transistor has a size smaller than that of said second insulated gate field effect transistor.

22. The semiconductor integrated circuit device as defined in claim 20, wherein said first insulated gate field effect transistor has a channel length shorter than that of said second gate insulated field effect transistor.

* * * * *